(12) United States Patent
Ker et al.

(10) Patent No.: US 6,335,698 B1
(45) Date of Patent: Jan. 1, 2002

(54) PROGRAMMABLE ANALOG-TO-DIGITAL CONVERTER WITH PROGRAMMABLE NON-VOLATILE MEMORY CELLS

(75) Inventors: Ming-Dou Ker, Hsinchu; Hsin-Chin Jiang, Taipei, both of (TW)

(73) Assignee: Industrial Technology Research Institute (TW)

( * ) Notice: Subject to any disclaimer, the term of this patent is extended or adjusted under 35 U.S.C. 154(b) by 0 days.

(21) Appl. No.: 09/414,943

(22) Filed: Oct. 8, 1999

(51) Int. Cl.$^7$ .............................. H03M 1/36; H03M 3/00
(52) U.S. Cl. .......................................... 341/159; 341/143
(58) Field of Search ................................ 341/136, 143, 341/155, 159, 118, 120, 156

(56) References Cited

U.S. PATENT DOCUMENTS

| | | | |
|---|---|---|---|
| 4,449,118 A | * 5/1984 | Dingwall et al. | ............ 341/136 |
| 4,763,106 A | 8/1988 | Gulczynski | |
| 5,034,905 A | 7/1991 | Widdau et al. | |
| 5,237,326 A | 8/1993 | Jeong | |
| 5,262,984 A | 11/1993 | Noguchi et al. | |
| 5,293,560 A | 3/1994 | Harari | |
| 5,420,587 A | 5/1995 | Michel | |
| 5,528,242 A | 6/1996 | Kumar | |
| 5,668,756 A | 9/1997 | Tomioka | |
| 6,037,890 A | * 3/2000 | Glass et al. | .................. 341/159 |
| 6,124,813 A | * 9/2000 | Robertson et al. | .......... 341/143 |

OTHER PUBLICATIONS

Fujita et al., "A Floating–Gate Analog Memory Device for Neural Networks," IEEE Transactions on Electron Devices (11/93), 40:2029–35.

Ong et al., "The EEPROM as an Analog memory Device," IEEE Transactions on Electron Devices (9/89), 36:1840–41.

* cited by examiner

*Primary Examiner*—Patrick Wamsley
(74) *Attorney, Agent, or Firm*—Finnegan, Henderson, Farabow, Garrett & Dunner, L.L.P.

(57) ABSTRACT

A flash analog-to-digital converter having a plurality of inverter circuits each comprising a programmable non-volatile memory cell and a load. The voltage values to be compared with the input voltage are threshold voltages individually programmable and stored on the plurality of memory cells. A comparison with the input voltage is performed by each of the memory cells, which are turned off to generate the value of logic "1" at an output when the input voltage is lower than the threshold voltage, and are turned on to generate the value of logic "0" at an output when the input voltage is greater than the threshold voltage.

12 Claims, 6 Drawing Sheets

| ADC TECHNOLOGY | fCONVERSION | RESOLUTION |
|---|---|---|
| SAR | < 1MHz | 8 - 18 BITS |
| FLASH | < 500MHz | 4 - 8 BITS |
| PIPELINE | < 80 MHz | 8 - 12 BITS |

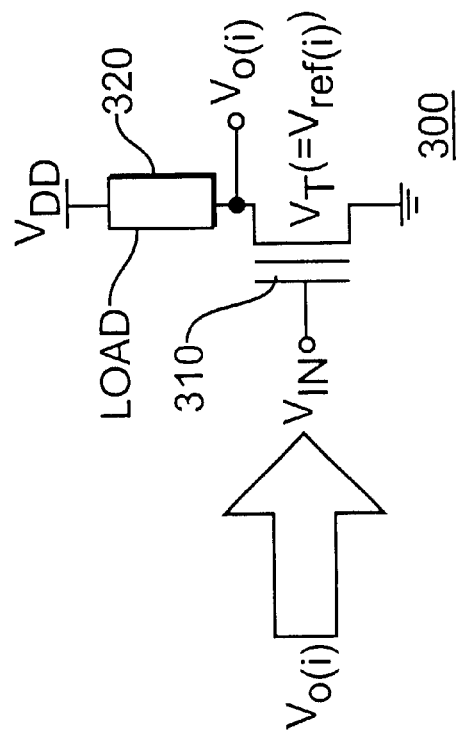
FIG. 5(b)
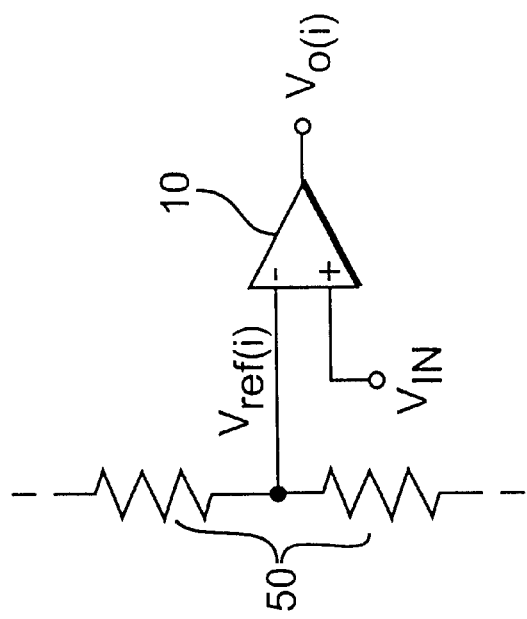
FIG. 5(a) *(PRIOR ART)*

PROGRAMMABLE ANALOG-TO-DIGITAL CONVERTER WITH PROGRAMMABLE NON-VOLATILE MEMORY CELLS

BACKGROUND OF THE INVENTION

A. Field of the Invention

The present invention relates to an improved apparatus for converting analog signals into digital signals.

B. Description of the Prior Art

The three major architectures for analog-to-digital converters (ADC) are the successive approximation (SAR), flash, and pipeline analog-to-digital converters. FIG. 1 gives approximations of the functional characteristics of each of the converter types.

The fastest of the three analog-to-digital converter architectures is the flash type of converter (also called parallel type). The conversion of the analog signal into digital form by a flash converter requires only a single cycle. As disclosed in FIG. 1, however, the resolution of the flash converters is generally limited to 8-bits in the current manufacturing process of such converters. The limitation on the resolution of flash converters relates to the fact that the circuitry required to implement a flash converter doubles with each 1-bit increase in resolution.

A block diagram of an exemplary flash converter is shown in FIG. 2. The flash converter includes $2^N-1$ latching comparators 10-(1) through 10-($2^N-1$) (N is the converting resolution in bit of the converter), $2^N$ resistors 50-(1) through 50-($2^N$), an input voltage $V_{IN}$, a reference voltage $V_{REF}$ and an encoder 20.

The input voltage to the analog-to-digital converter is coupled to the non-inverting terminal of each of the latching comparators 10. The reference voltage $V_{REF}$ is coupled to the inverting terminal of each of the latching comparators 10 via resistive voltage divider string 40. Voltage dividing string is comprised of $2^N$ equal valued resistors 50 serially connected together between reference voltage $V_{REF}$ and ground. The serially connected resistors 50 couple $2^N-1$ different voltages $V_{ref}$ to the $2^N-1$ comparators 10. Each of the voltages $V_{ref}$ is biased one least significant bit (LSB) higher than that of the preceding voltage $V_{ref-1}$. If the input voltage $V_{IN}$ is higher than voltage $V_{ref}$, comparator 10 will output a logic "1". If the input voltage $V_{IN}$ is lower than the voltage $V_{ref}$, comparator 10 will output a logic "0".

The outputs from the group of comparators 10 is called a "thermometer" code. This thermometer code is subsequently converted to a conventional binary output by encoder 20.

Implementing an 8-bit flash analog-to-digital converter in accordance with FIG. 2 would require 255 comparators and 256 resistors for the voltage divider string. An exemplary embodiment of a comparator 10 for use in the flash converter of FIG. 2 is shown in FIG. 3. As shown in FIG. 3, comparator 10 requires at least eight transistors 110-1 through 110-8. In order to increase the resolution of the 8-bit converter by 1 bit to a 9-bit converter, the number of comparators increases to 511 and the number of resistors increases to 512. Further, the number of transistors required to implement the 511 comparators in accordance with the comparator circuit of FIG. 3 would be 4088. This 1-bit increase doubles the requisite chip area and power dissipation of the flash converter.

In order to reduce the number of comparators required to implement a converter, an alternative architecture flash analog-to-digital converter, called the two-step flash ADC or two-stage flash ADC, has been disclosed in U.S. Pat. Nos. 5,528,242 to Kumar and 5,420,587 to Michel. The two steps or stages performed by an exemplary 8-bit converter of this type comprise the separate determination of the four most significant bits (MSB) and the four least significant bits (LSB). The determination of the four most significant bits is performed by a four bit flash analog to digital converter called the MSB ADC 210, which provides a gross determination of the value of $V_{IN}$ by performing a comparison against sixteen reference voltages $V_{ref}$. The reference voltage corresponding to the transition of the output of the converters of the MSB ADC from "1" to "0" (high to low) is then coupled to a second four bit flash ADC called the LSB ADC 220, which determines the four least significant bits of the converted signal.

The two-step or two-stage type converters reduce the number of comparators required to 2 ($2^{N/2}-1$), but also provide reduced performance relative to the conventional flash converters. Further, although the number of comparators is reduced, the complexity of the circuitry required remains high.

SUMMARY OF THE INVENTION

The object of the invention is to provide an improved analog-to-digital converter.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

To achieve the objects and in accordance with the purpose of the invention, as embodied and broadly described herein, the invention comprises a flash analog-to-digital converter having a plurality of inverter circuits for providing a comparison of an input voltage with a plurality of threshold voltages, and an encoder for producing a digital signal from said comparison. Each of the inverter circuits comprises a programmable memory cell and a load.

It is to be understood that both the foregoing general description and the following detailed description are exemplary and explanatory only and are not restrictive of the invention, as claimed.

The accompanying drawings, which are incorporated in and constitute a part of this specification, illustrate one embodiment of the invention and together with the description, serve to explain the principles of the invention.

BRIEF DESCRIPTION OF THE DRAWINGS

FIG. 5(a) is a circuit diagram of exemplary elements of a prior art comparator circuit.

FIG. 5(b) is a circuit diagram of an inverter circuit in accordance with the present invention.

DESCRIPTION OF THE PREFERRED EMBODIMENT

Reference will now be made in detail to the present preferred embodiment of the invention, an example of which is illustrated in the accompanying drawings. Wherever possible, the same reference numbers will be used throughout the drawings to refer to the same or like parts.

Figures 1, 2:
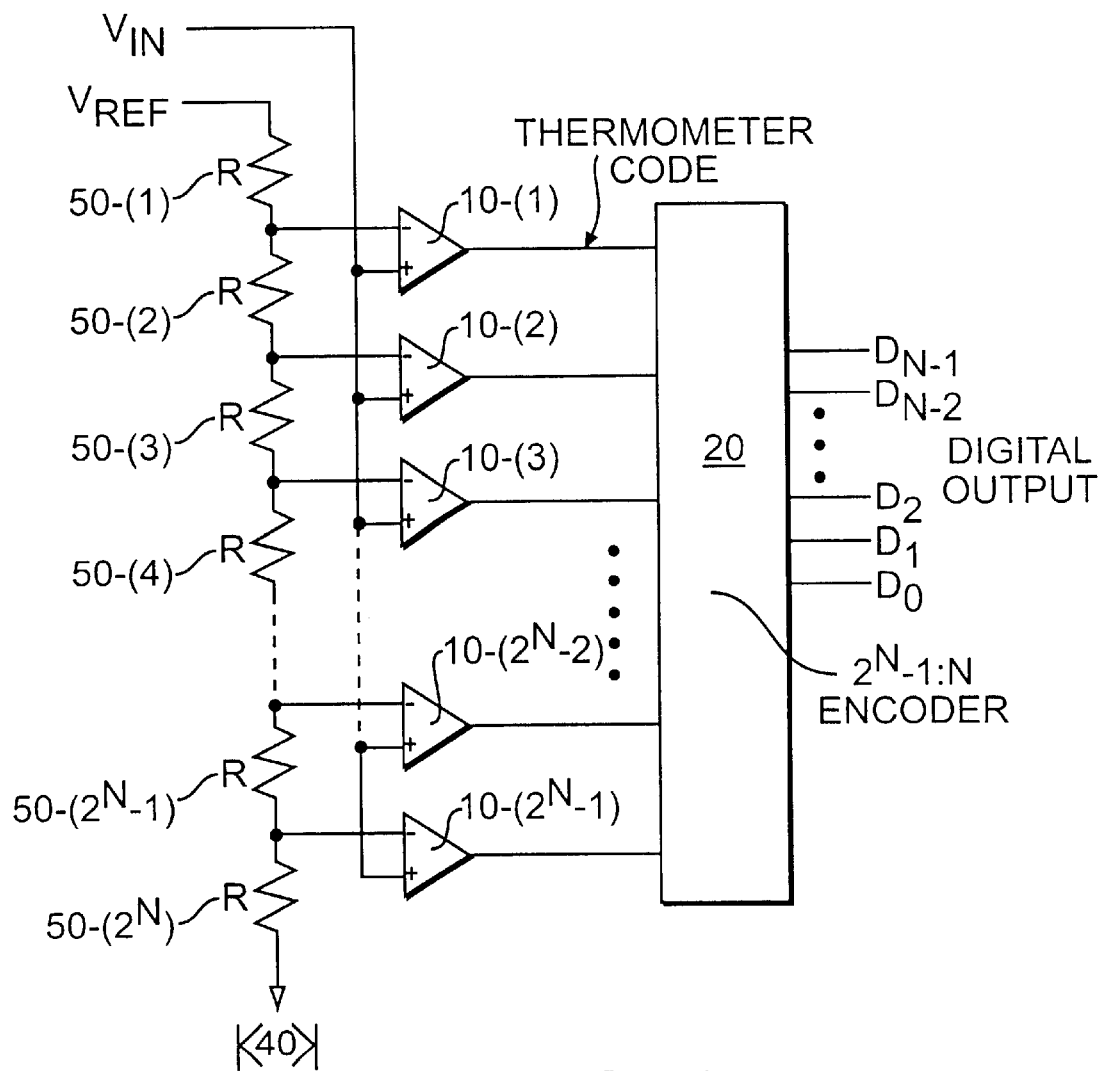
FIG. 1 is a table of the functional characteristics of selected ADC devices.
FIG. 2 is a circuit diagram of an exemplary prior art flash analog-to-digital converter.
Figure 3:
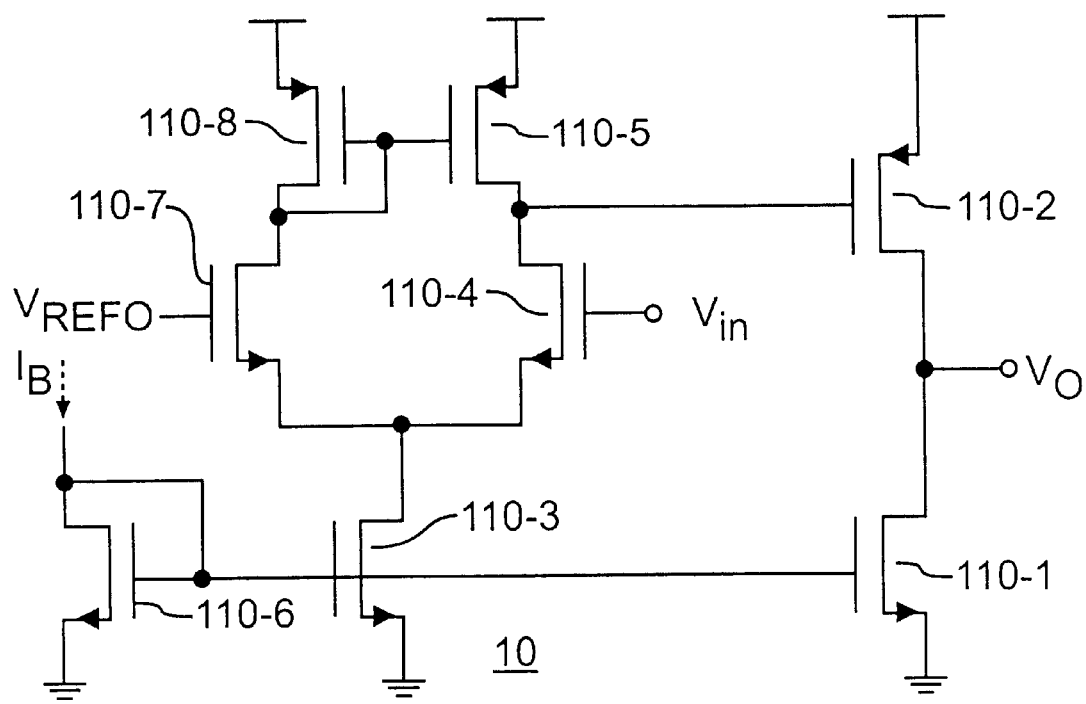
FIG. 3 is a circuit diagram of an exemplary prior art comparator circuit.
Figure 4:
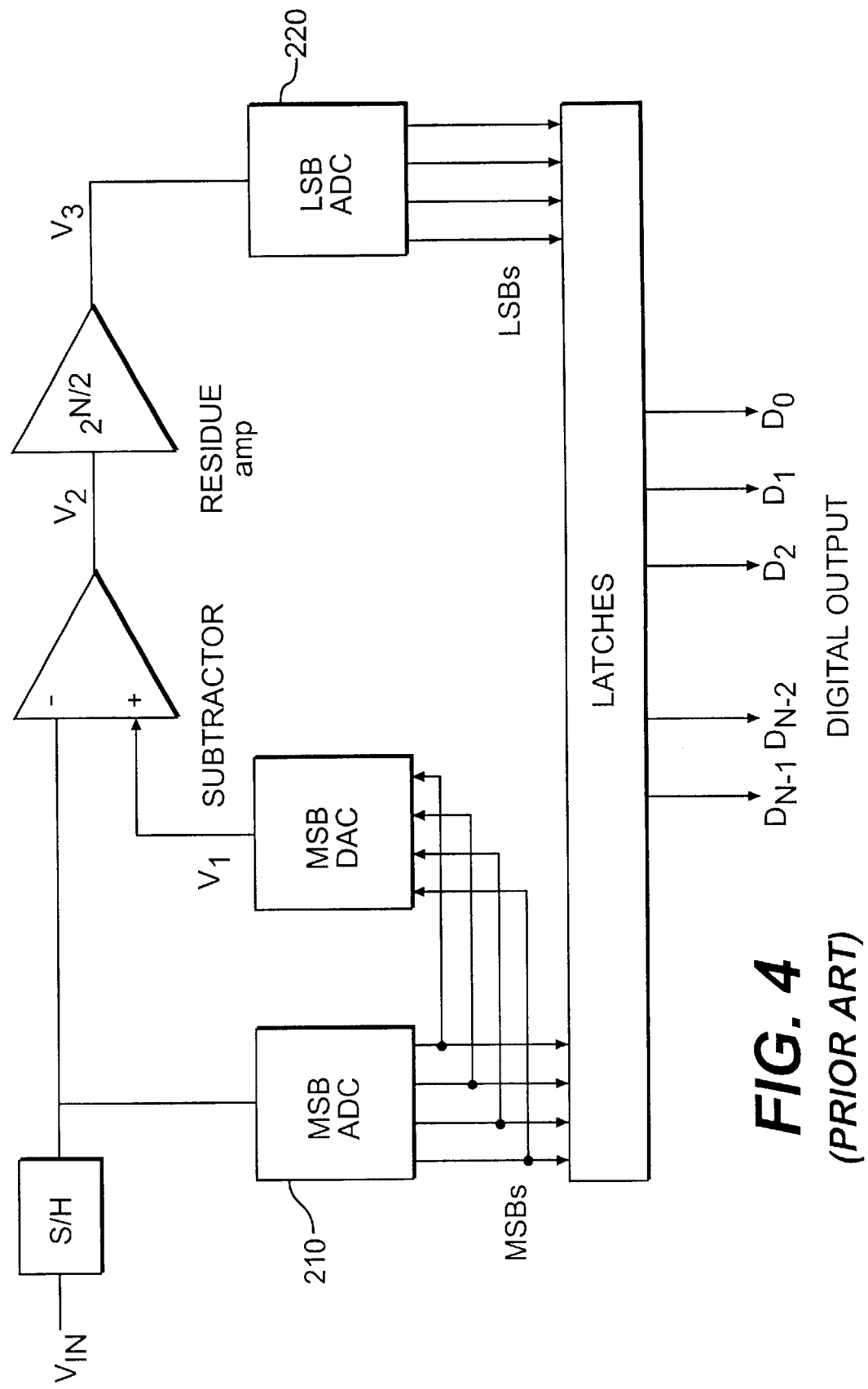
FIG. 4 is a circuit diagram of an exemplary prior art two-step flash analog-to-digital converter.

As noted above, the inherent difficulty in implementing a flash ADC of the type shown in FIG. 2 relates to the number of resistors and comparators required. The object of the invention, therefore is to obviate the complexity of the conventional flash ADC architecture by implementing a simple circuit in place of the multiplicity of the circuit elements required by the conventional flash ADC.

FIG. 5(a) shows elements of the conventional flash ADC that are replaced by the circuit of the present invention. Specifically, FIG. 5(a) shows a comparator 10 coupled to two resistors 50 of resistive voltage divider string 40.

FIG. 5(b) shows an exemplary circuit in accordance with the present invention. The circuit of FIG. 5(b) is an inverter 300 having a programmable non-volatile memory cell 310 and a load component 320. Load component 320 can be implemented as a passive element, e.g., a resistor, or an active element, e.g., a diode connected MOSFET.

Programmable non-volatile memory cell 310 has a threshold voltage $V_T$ on its floating gate, which can be adjusted via a write/erase circuit (not shown in FIG. 5(b)). The threshold voltage $V_T$ corresponds functionally to the voltage $V_{ref(i)}$ applied to comparator 10 by resistive voltage divider string 40 of FIG. 2. The analog input voltage $V_{IN}$ is applied to the gate of programmable non-volatile memory cell 310. If the input voltage $V_{IN}$ is less than the threshold voltage $V_T$, the channel of memory cell 310 is closed. The potential of the output node $V_{o(I)}$ is pulled up to $V_{DD}$, which corresponds to a logic "1" through load 320. If the input voltage $V_{IN}$ is greater than the threshold voltage $V_T$, the channel of memory cell 310 is open. The potential of the output node $V_{o(I)}$ is pulled down to ground, which corresponds to a logic "0", through the memory cell 310. Inverter 300, therefore, replaces the operation of comparator 10 and resistive voltage divider string 40.

Figure 6A:
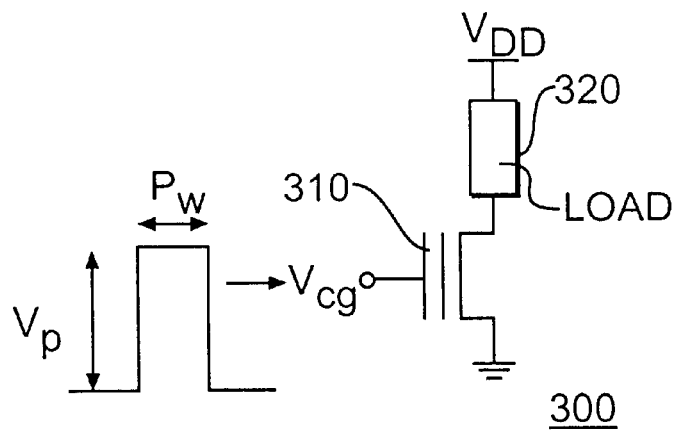
FIG. 6(a) is a diagram of an exemplary method of programming a memory cell in accordance with the present invention.

There are a number of known methods for inducing a charge on the floating gate of memory cell 310. The induced charge produces threshold voltage $V_T$. FIG. 6(a) shows two exemplary methods of producing threshold voltage $V_T$ in accordance with the invention. Threshold voltage $V_T$ is induced on the floating gate of memory cell 320 by applying a program voltage $V_{cg}$ to the gate of programmable non-volatile memory cell 310 while the source and drain of memory cell 320 are grounded. The program voltage $V_{cg}$ causes charge to migrate to the floating gate of memory cell 310. In the example of FIG. 6(a) the threshold voltage of cell 310 is controlled by adjusting either the amplitude $V_P$ or the width (duration) $P_W$ of program voltage $V_{cg}$ while keeping the other variable constant.

Figure 6B:
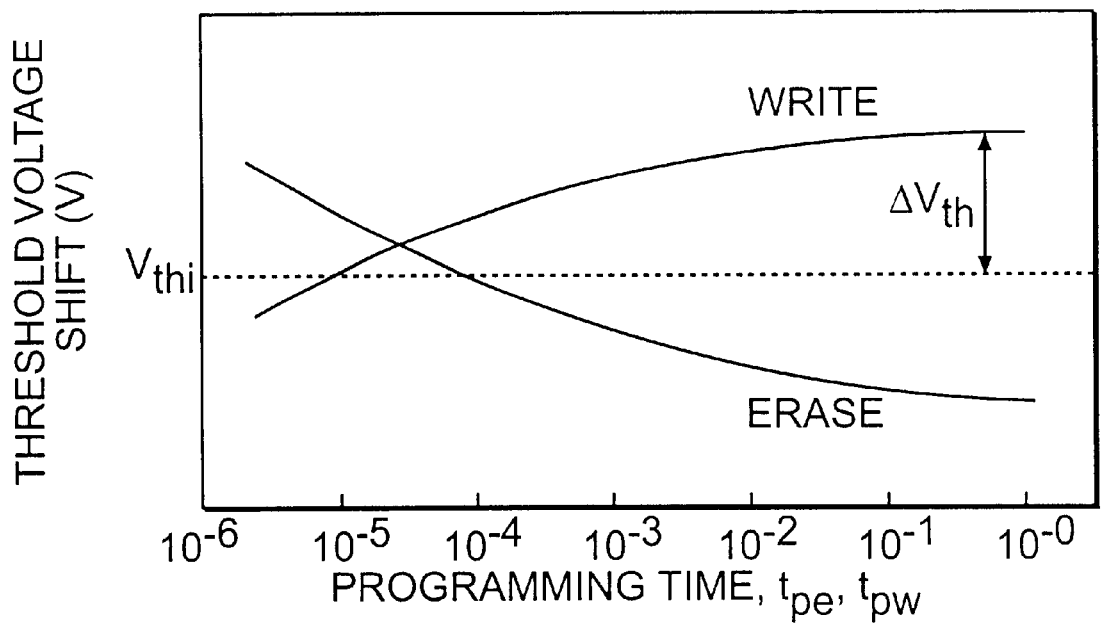
FIG. 6(b) is a schematic graph relating program voltage width and threshold voltage for two program voltage amplitudes.

The procedure for erasing the threshold voltage $V_T$ of memory cell 310 is identical to the procedure for programming the threshold voltage $V_T$, except that the amplitude $V_P$ of program voltage $V_{cg}$ is set to be negative. FIG. 6(b) is a schematic graph of the relationship between threshold voltage $V_T$ and program voltage width $P_W$ for two program voltage amplitudes $V_P$, a write amplitude and an erase amplitude.

Figure 7:
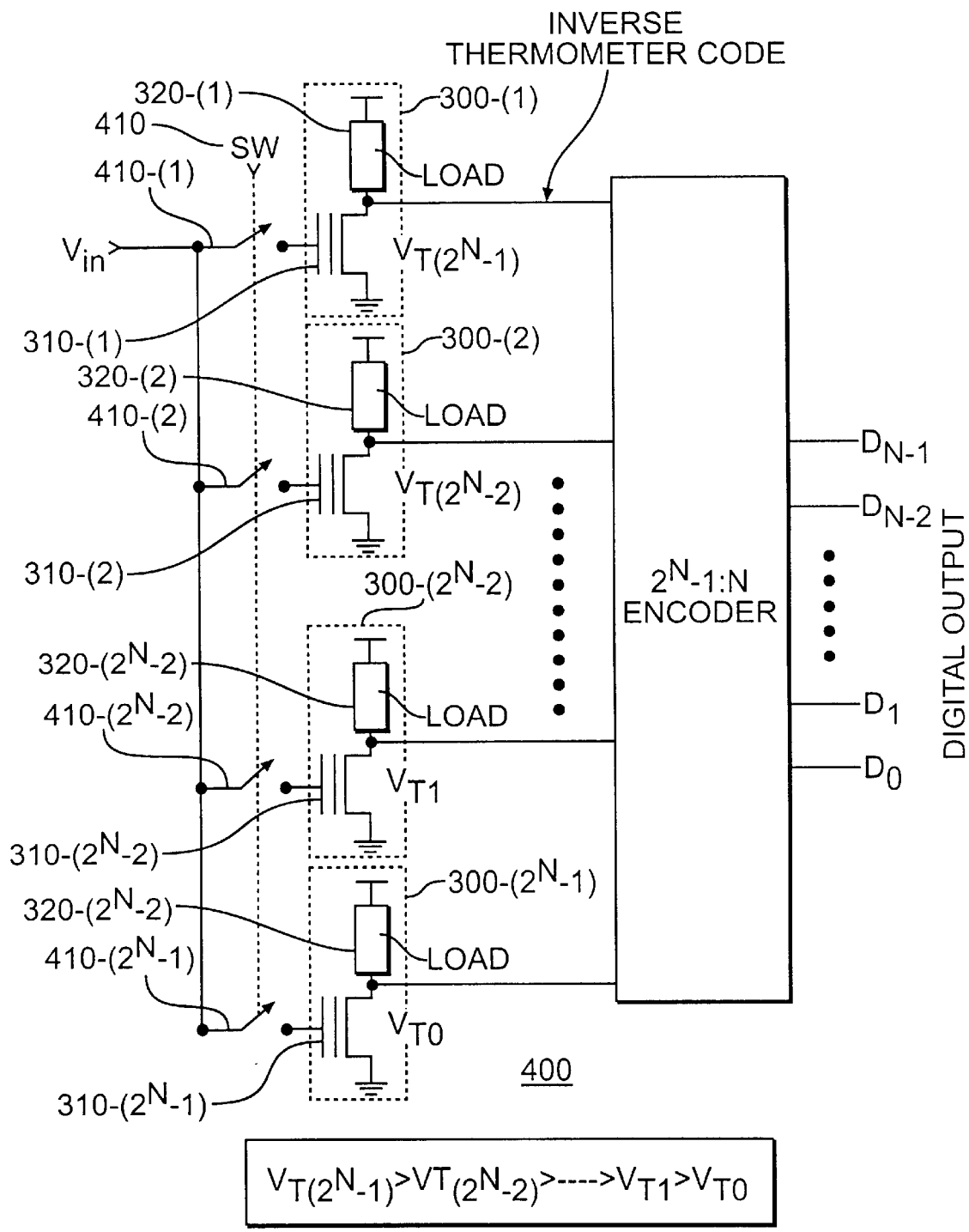
FIG. 7 is a circuit diagram of a flash ADC in accordance with the present invention.

FIG. 7 shows an exemplary implementation of a flash ADC 400 utilizing inverter circuits 300-1 through 300-($2^N$-1) in accordance with the present invention. For N-bit resolution there are $2^N$-1 inverter circuits 300. Flash ADC 400 also includes a set of switches 410-1 through 410-($2^N$-1) with a common control 410, and an encoder 420.

Each of the $2^N$-1 inverter circuits 300-1 through 300-($2^N$-1) is programmed with a threshold voltage $V_T$. In operation the threshold values $V_T$ would be arranged such that $V_{T(0)} < V_{T(1)} < V_{T(2)} \ldots$. The difference in threshold voltage between any two adjacent inverter circuits would preferably be set equal to one LSB. The gate of each inverter circuit is coupled to the analog input signal $V_{IN}$ through the switches 410-1 through 410-($2^N$-1). Instead of a thermometer code as produced by the flash ADC of FIG. 2, inverter circuits 300 of FIG. 7 produces an inverse thermometer code (i.e., each of the inverter circuits produces a logic "1" (high) when $V_{IN}$ is less than threshold voltage $V_T$ and produces a logic "0" (low) when $V_{IN}$ is greater than the threshold voltage $V_T$). The inverse thermometer code is then encoded by encoder 420 to obtain the desired digital word corresponding to the amplitude of input signal $V_{IN}$.

During the writing/erasing procedure, the common control 410 opens the switches 410-1 through 410-($2^N$-1) to decouple the gate of each inverter circuit from the analog input voltage $V_{IN}$, and the writing/erasing of each memory cell 310 can be performed independently by a single write/erase circuit via address switches (not shown). As is known in the art, a system of address switches permits the program voltage $V_{cg}$ from the single write/erase circuit to be coupled to any one of memory cells 310 in order to program the chosen cell. As noted above, the relationship between the reference voltages of a conventional flash ADC are determined by the value of resistors 50, which are identical. The reference voltages $V_{ref}$ of comparators 10 have a set linear relationship corresponding to the LSB of the converter. Memory cells 310 of the present invention, however, provide the ability to choose any quantization level, linear or non-linear. Further, these values can be adjusted depending on the specific requirements of the user.

It will be apparent to those skilled in the art that various modifications and variations can be made in the operation of the flash ADC circuit of the present invention and in construction of this circuit without departing from the scope or spirit of the invention.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A flash analog-to-digital converter comprising:

a plurality of inverter circuits for providing a comparison of an input voltage with a plurality of threshold voltages;

wherein the plurality of inverter circuits is equal to $2^N$-1, wherein N equals a number of bits of the converter; and an encoder for producing a digital signal from said comparison.

2. The flash analog-to-digital converter of claim 1, wherein said plurality of inverter circuits each comprises:

a programmable memory cell having a threshold voltage programmed thereon; and a load coupled to said programmable memory cell.

3. The flash analog-to-digital converter of claim 2 further comprising a write/erase circuit for individually programming the threshold voltage of each of said memory cells.

4. The flash analog-to-digital converter of claim 3 further comprising a plurality of address switches for selectively applying a program voltage from said write/erase circuit to one of said memory cells.

5. The flash analog-to-digital converter of claim 2, wherein the load is one of a resistor and diode connected MOSFET.

6. The flash analog-to-digital converter of claim 2, wherein said programmable memory cell is a non-volatile memory cell.

7. A flash analog-to-digital converter comprising:

a plurality of inverter circuits for providing a comparison of an input voltage with a plurality of threshold voltages;

wherein said plurality of inverter circuits produce an inverse thermometer code; and an encoder for producing a digital signal from said comparison.

8. The flash analog-to-digital converter of claim 7, wherein said plurality of inverter circuits each comprises:

a programmable memory cell having a threshold voltage programmed thereon; and a load coupled to said programmable memory cell.

9. The flash analog-to-digital converter of claim 8 further comprising a write/erase circuit for individually programming the threshold voltage of each of said memory cells.

10. The flash analog-to-digital converter of claim 9 further comprising a plurality of address switches for selectively applying a program voltage from said write/erase circuit to one of said memory cells.

11. The flash analog-to-digital converter of claim 8, wherein the load is one of a resistor and diode connected MOSFET.

12. The flash analog-to-digital converter of claim 8, wherein said programmable memory cell is a non-volatile memory cell.

* * * * *